(12) United States Patent
Onai et al.

(10) Patent No.: US 10,050,009 B2
(45) Date of Patent: Aug. 14, 2018

(54) METHODS AND APPARATUS FOR IMPROVED BONDING

(71) Applicant: SEMICONDUCTOR COMPONENTS INDUSTRIES, LLC, Phoenix, AZ (US)

(72) Inventors: Nobuhisa Onai, Ota (JP); Takayuki Taguchi, Hanyu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 47 days.

(21) Appl. No.: 15/135,973

(22) Filed: Apr. 22, 2016

(65) Prior Publication Data

US 2017/0077061 A1    Mar. 16, 2017

Related U.S. Application Data

(60) Provisional application No. 62/218,735, filed on Sep. 15, 2015.

(51) Int. Cl.
| | |
|---|---|
| B23K 37/04 | (2006.01) |
| B25B 11/00 | (2006.01) |
| H01L 23/00 | (2006.01) |
| B23K 20/00 | (2006.01) |

(Continued)

(52) U.S. Cl.
CPC ............ *H01L 24/78* (2013.01); *B23K 20/004* (2013.01); *B23K 20/233* (2013.01); *B23K 20/2333* (2013.01); *B23K 37/0443* (2013.01); *H01L 24/85* (2013.01); *B23K 2201/42* (2013.01); *B25B 11/005* (2013.01); *H01L 2224/78744* (2013.01); *H01L 2224/78842* (2013.01); *H01L 2224/78983* (2013.01); *H01L 2224/8515* (2013.01); *H01L 2224/85205* (2013.01)

(58) Field of Classification Search
CPC ...................................................... B23K 37/04
See application file for complete search history.

(56) References Cited

U.S. PATENT DOCUMENTS

| | | | | |
|---|---|---|---|---|
| 4,643,128 | A * | 2/1987 | Bracher | C23C 14/50 |
| | | | | 118/503 |
| 4,998,712 | A * | 3/1991 | Park | B25B 5/061 |
| | | | | 269/152 |

(Continued)

FOREIGN PATENT DOCUMENTS

DE     3801813 A1 *    8/1989    ............. G01B 3/002

OTHER PUBLICATIONS

Mayer et al., Ultrasonic Bonding: Understanding How Process Parameters Determine the Strength of Au—Al Bonds, symposium, 2002, pp. 626-631, Proc. Intl. Symposium on Microelectronic, IMAPS, Denver, CO, USA.

*Primary Examiner* — Devang R Patel
(74) *Attorney, Agent, or Firm* — The Noblitt Group, PLLC; Hettie L. Haines

(57) ABSTRACT

Various embodiments of the present technology may comprise a method and apparatus for improved bonding and may operate in conjunction with a main platform configured to support a substrate. Movable members may allow the substrate to be positioned on the main platform when rotated to a first position and apply a force to a predetermined area on an upward facing surface of the substrate when rotated to the second position.

11 Claims, 21 Drawing Sheets

(51) Int. Cl.
*B23K 20/233* (2006.01)
*B23K 101/42* (2006.01)

(56) References Cited

U.S. PATENT DOCUMENTS

| | | | | |
|---|---|---|---|---|
| 5,322,207 A | * | 6/1994 | Fogal | H01L 24/78 228/180.5 |
| 5,974,654 A | * | 11/1999 | Morita | H05K 13/0069 269/152 |
| 6,047,877 A | * | 4/2000 | Ball | B23K 20/004 228/180.5 |
| 6,861,733 B2 | * | 3/2005 | Kek | H01L 21/68728 257/666 |

* cited by examiner

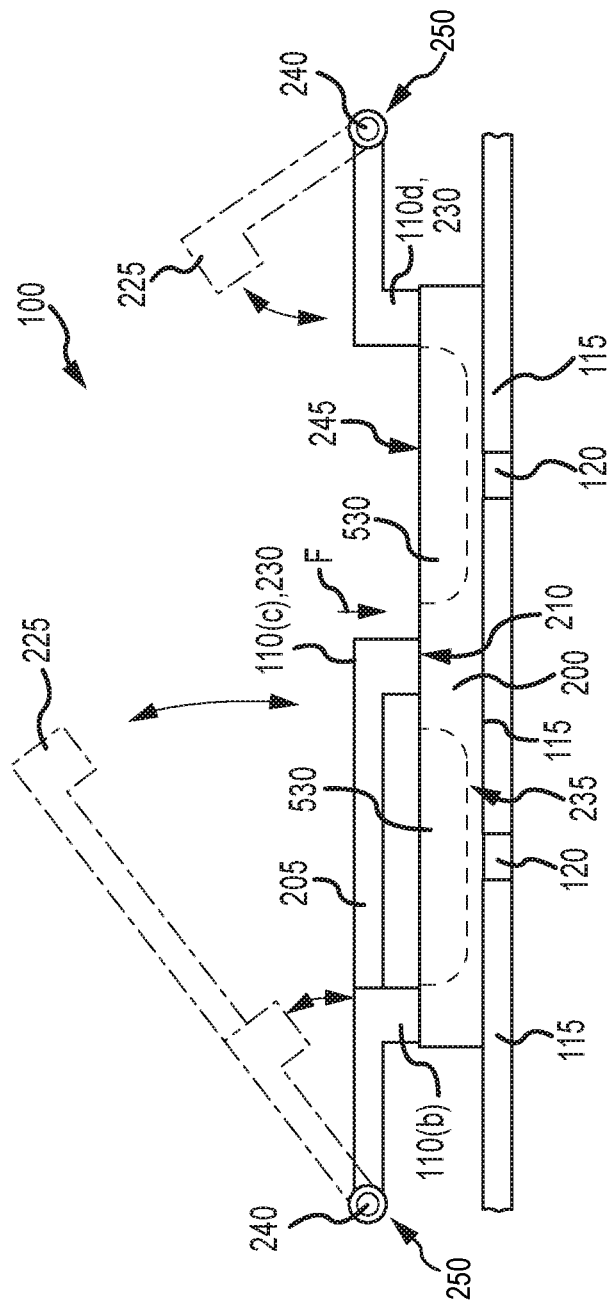

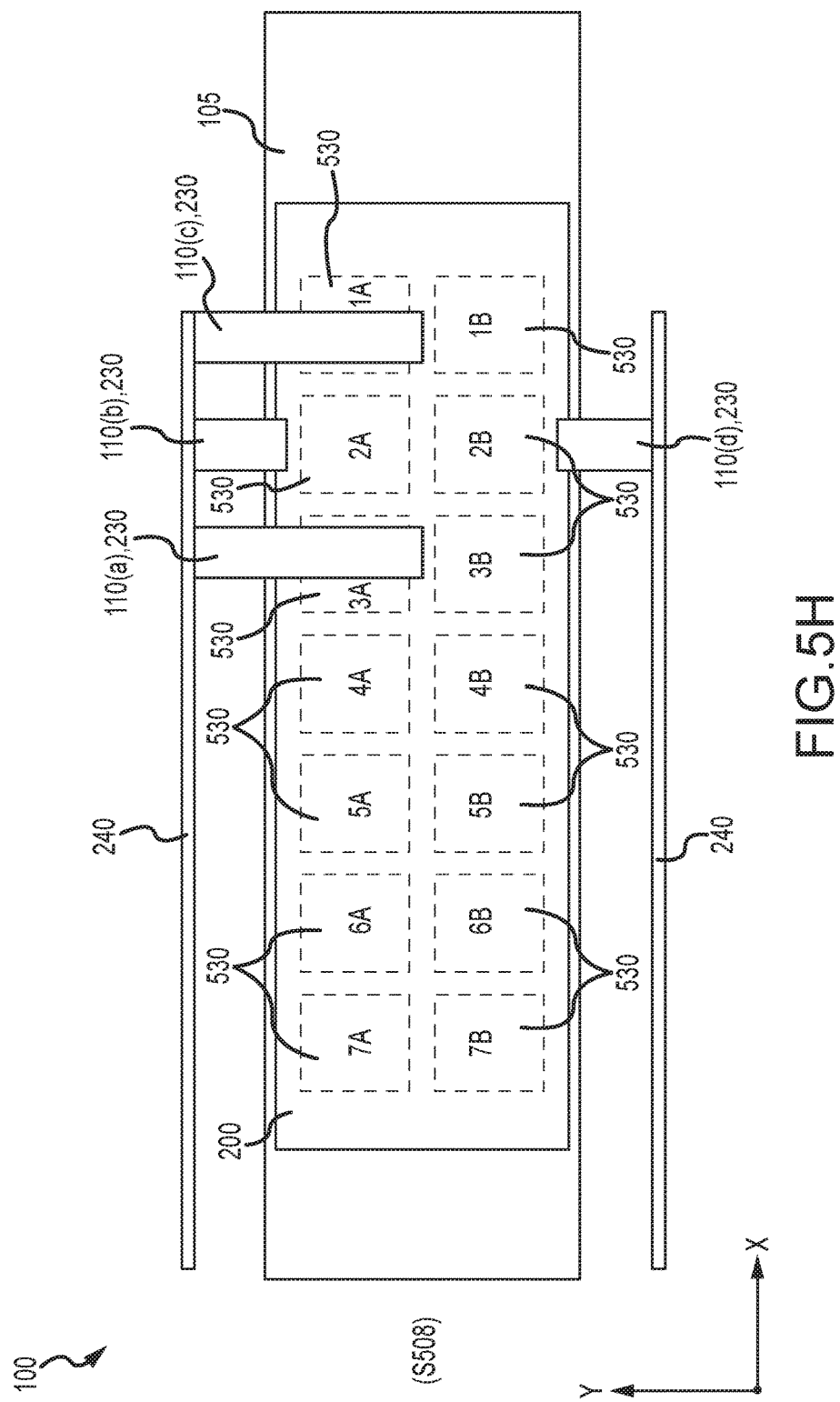

METHODS AND APPARATUS FOR IMPROVED BONDING

CROSS-REFERENCE TO RELATED APPLICATION

This application claims the benefit of U.S. Provisional Patent Application Ser. No. 62/218,735, filed on Sep. 15, 2015, and incorporates the disclosure of the application in its entirety by reference. To the extent that the present disclosure conflicts with any referenced application, however, the present disclosure is to be given priority.

BACKGROUND

Wire bonding is a commonly used interconnection technology in the microelectronics manufacturing and packaging industry. More specifically, a wire bonder (also known as a wire bonding machine) forms wire interconnections between respective locations to be electrically interconnected, such as to connect a bond pad of a semiconductor device to a lead frame or carrier. Wire bonding machines be used to form conductive bumps (which bumps may, or may not, be used in connection with wire loops).

The ultrasonic system of a wire bonder comprises an ultrasonic generator and a transducer. The generator provides electrical power to the transducer at a given frequency. The transducer typically includes a driver such as a stack of piezoelectric elements (e.g., piezoelectric crystals, piezoelectric ceramics, etc.). Electrical energy is applied to the driver and the driver converts the electrical energy to mechanical energy. The mechanical energy is transferred to a bonding tool tip that oscillates with an amplitude corresponding to the applied electrical energy.

A conventional wire bonding process involves the following steps: (1) a wire is placed in contact with a bonding pad, and a bonding tool is placed on top of the wire; (2) the bonding tool applies pressure against the wire, forcing the wire against the bonding pad; (3) the ultrasonic generator applies a high frequency power signal to the transducer, which transduces the signal into an ultrasonic vibration, causing the bonding tool to oscillate in the plan of the bonding pad; (4) the friction between the wire and the bonding pad is overcome, and the wire scrubs against the surface of the bonding pad, causing localized softening and plastic flow of the wire and/or bonding pad; (5) after several milliseconds of scrubbing, the transducer is de-energized, which stops the motion of the bonding tool and wire and allows a weld to form between the wire and the bonding pad; and (6) the bonding tool is lifted away from the now bonded wire.

Certain factors may cause the bond to be defective. For example, a bond may not form properly if the bonding pad or the wire is not clean, the transducer may be energized too long (which may cause overheating of the materials or fracturing of the substrate), or there may be misalignment or curvature of the substrate. Curvature of the substrate, which may be due to warpage caused by thermal mismatch between the substrate layers, may cause a decrease in the oscillation amplitude of the bonding tool tip. An air gap that is created when the substrate is warped may cause the ultrasonic vibrations to be dispersed throughout the substrate and the air gap, which reduces the frictional force at the tip of the wire bonding tool, decreases pressure bonding strength and/or promotes improper bonding. As a result, the wire may peel away from the surface of the bond pad or the substrate. An improper or faulty electrical connection between the electrical components, such as semiconductor chips, integrated circuits (ICs), resistors, transistors, capacitors, and the like, and the substrate can lead to functional failure of the device or equipment which the faulty connection occurs.

SUMMARY OF THE TECHNOLOGY

Various embodiments of the present technology may comprise a method and apparatus for improved bonding and may operate in conjunction with a main platform configured to support a substrate. Movable members may allow the substrate to be positioned on the main platform when rotated to a first position and apply a force to a predetermined area on an upward facing surface of the substrate when rotated to the second position.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

FIGS. 2A-B representatively illustrate a cross section of the apparatus in accordance with an exemplary embodiment of the present technology;

FIGS. 5A-J representatively illustrate a method for wire bonding utilizing the apparatus in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various processors, controllers, timing devices, vacuum sources, platforms, movable members, and the like, which may carry out a variety of functions. In addition, the present technology may be practiced in conjunction with any appropriate step in the processing or fabrication of semiconductor devices and the apparatus and method described are merely exemplary applications for the technology. Further, the present technology may employ any number of conventional techniques for actuating moving, applying force to elements of the apparatus, and pressurizing elements placed on the apparatus.

Methods and apparatus for improved wire bonding according to various aspects of the present technology may operate in conjunction with any suitable semiconductor or microelectronic fabrication process. Various representative implementations of the present technology may be applied to any appropriate substrate.

Figure 6:
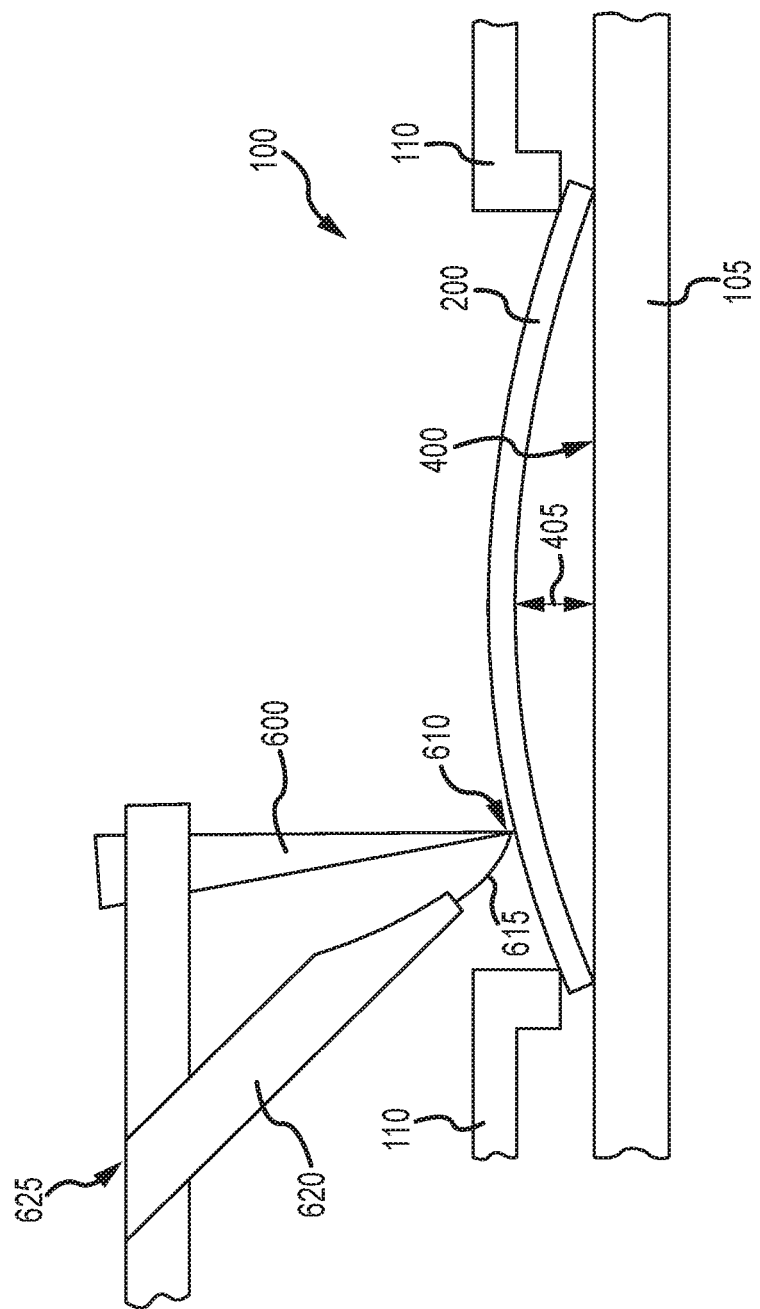
FIG. 6 representatively illustrates wire bonding on a warped substrate.
Figure 7:
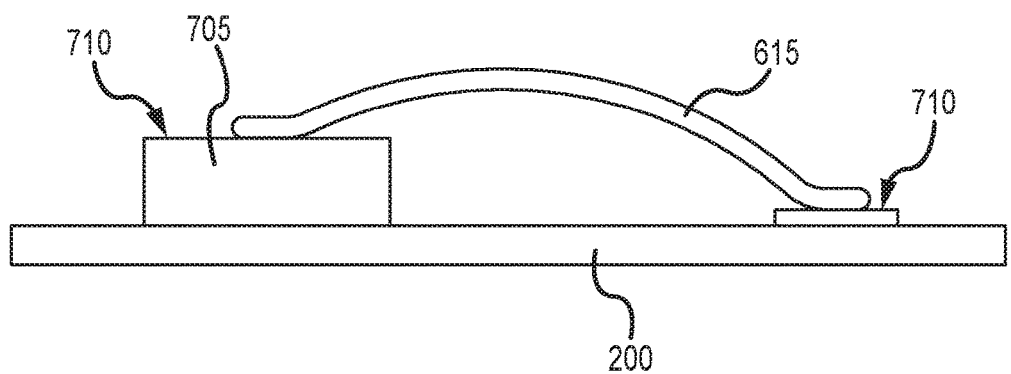
FIG. 7 representatively illustrates wire bonding in accordance with an exemplary embodiment of the present technology.

Referring to FIGS. 6 and 7, a wire bonding apparatus 100 and process may utilize a wire bonding machine 625 comprising a wire bonding tool 600 and a wire clamp 620. The wire bonding tool 600 may oscillate at a predetermined frequency based on the electrical energy produced by a transducer (not shown) and produce ultrasonic vibrations.

Figure 1:
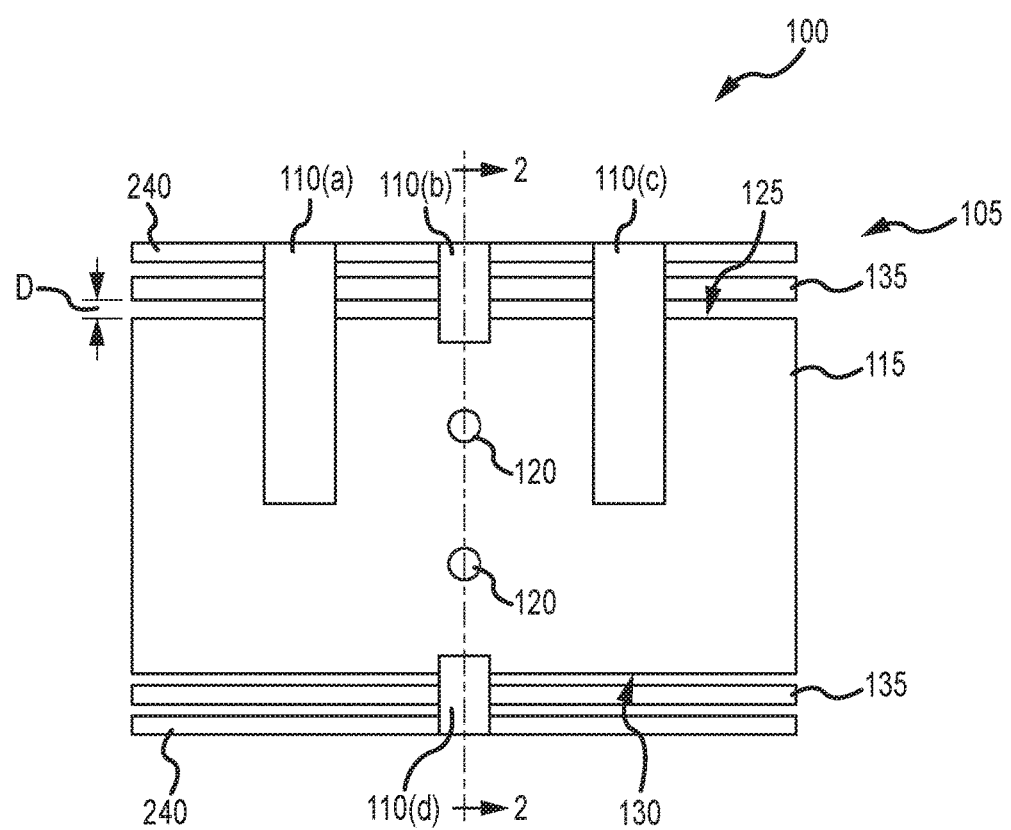
FIG. 1 representatively illustrates a top view of an apparatus in accordance with an exemplary embodiment of the present technology.

Referring now to FIGS. 1 and 2, in an exemplary embodiment of the present technology, the wire bonding apparatus 100 may comprise a stage 105 and a plurality of movable members 110. The stage 105 and movable members 110 may receive and secure the substrate 200 to provide a stable and planar surface on which to create electrical connections, such as a wire bond or a die bond.

The stage 105 may support a substrate 200 during a bonding operation. The stage 105 may comprise any suitable device or system for supporting the substrate 200. For example, in one embodiment, the stage 105 may comprise a main platform 115 including a flat plane to receive and support the substrate 200. The stage 105 may further comprise an auxiliary platform 135 disposed proximate to and separated from the main platform 115 by a distance D to further support the substrate 200. In one embodiment, the auxiliary platform 135 may also serve as a transport rail for the substrate 200. In this embodiment, a transport arm (not shown) may utilize the space in between the main platform 115 and the auxiliary platform 135 to move the substrate 200 across the main platform 115. In other embodiments, the stage 105 may comprise one continuous support surface.

The stage 105 may further include a heat source to heat the substrate 200. For example, in applications comprising gold materials, the substrate 200 and electrical components disposed in the substrate 200 may benefit from being heated to a predetermined temperature to achieve the desired bonding between electrical components. In various embodiments, however, the heat source may not be needed to achieve the desired bonding, for example if a wire 615 (FIG. 6) comprises aluminum and/or if a bonding surface 710 (FIG. 7) comprises nickel, due to the malleable properties of the metals.

In various embodiments, the stage 105 may comprise any size and shape, and may be fabricated out of any material suitable for the particular application of the apparatus 100.

In the present exemplary embodiment, the stage 105 may apply a vacuum pressure, such as through an opening 120. The opening 120 may comprise any suitable shape or size and may be configured according to a particular application. The opening 120 may be positioned and located on the stage 105 such that the opening 120 aligns with a predetermined area on the substrate 200. For example, referring now to FIG. 2, the substrate 200 may comprise a device area 530 and the opening 120 may be positioned to align with the center of the device area 530. In operation, a vacuum source may apply a vacuum pressure to a downward facing surface 235 of the substrate 200 to create a pressure force on the substrate 200 to improve contact between the substrate 200 and the main platform 115 of the stage 105.

Figure 2B:
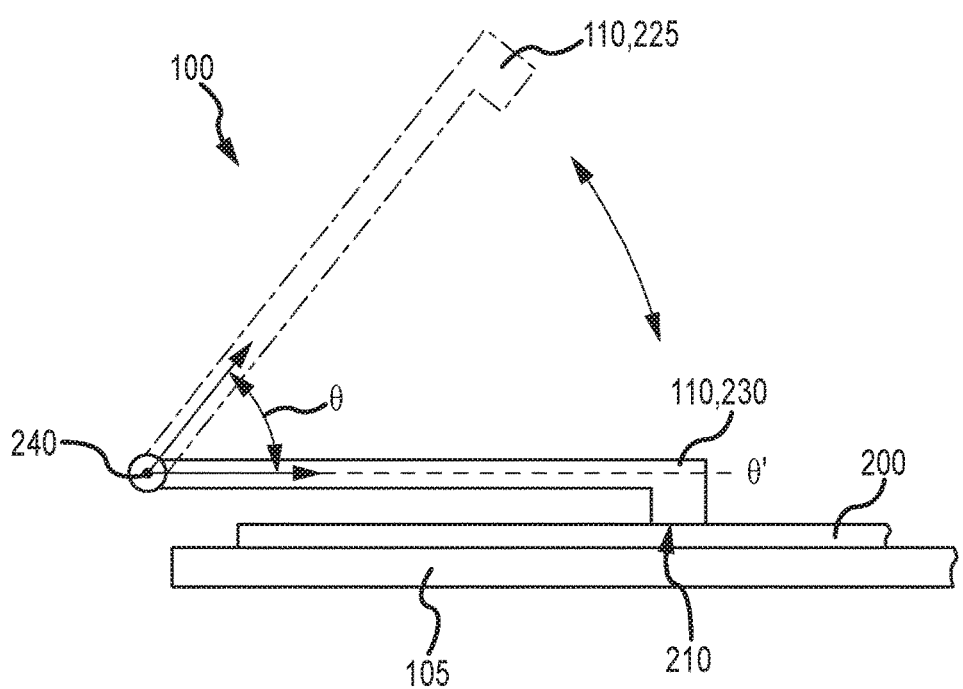

Referring to FIGS. 2A-B, each movable member 110 may comprise an extendable arm 205 and a contact portion 210. The movable members may engage the substrate 200 to maintain the position of the substrate on the stage 105. For example, the extendable arm 205 may be pivotably coupled to a shaft 240, allowing the extendable arm 205 to rotate about the shaft 240 by an angle ⊖. The movable members 110 may rotate between at least two positions. For example, the movable members 110 may have a first position 225 and a second position 230, where the first position 225 may be defined by the angle ⊖, and the second position 230 may be defined as having an angle ⊖' which allows the contact portion 210 to come into contact with the substrate 200.

Figure 3:
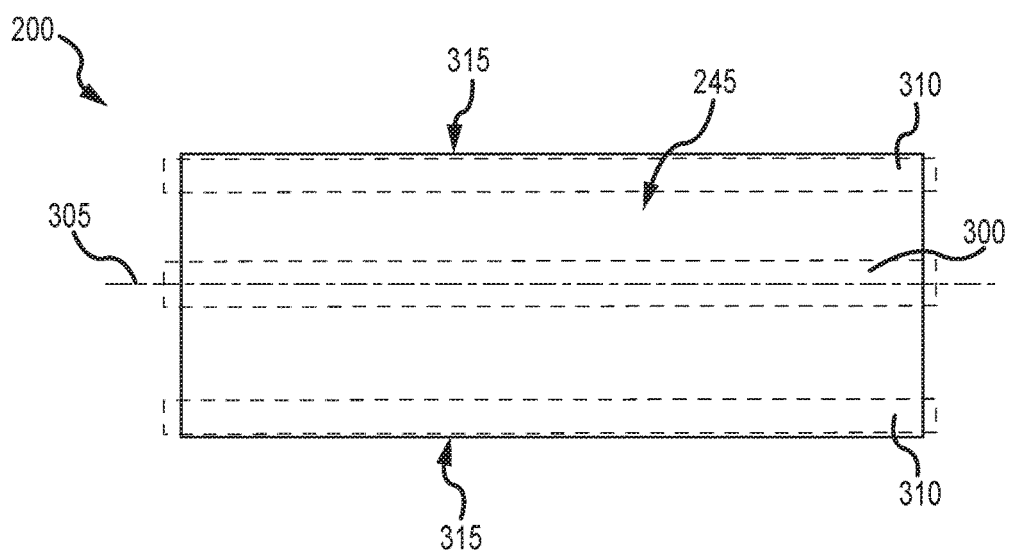
FIG. 3 representatively illustrates contact areas of a substrate in accordance with an exemplary embodiment of the present technology.
Figure 5A:
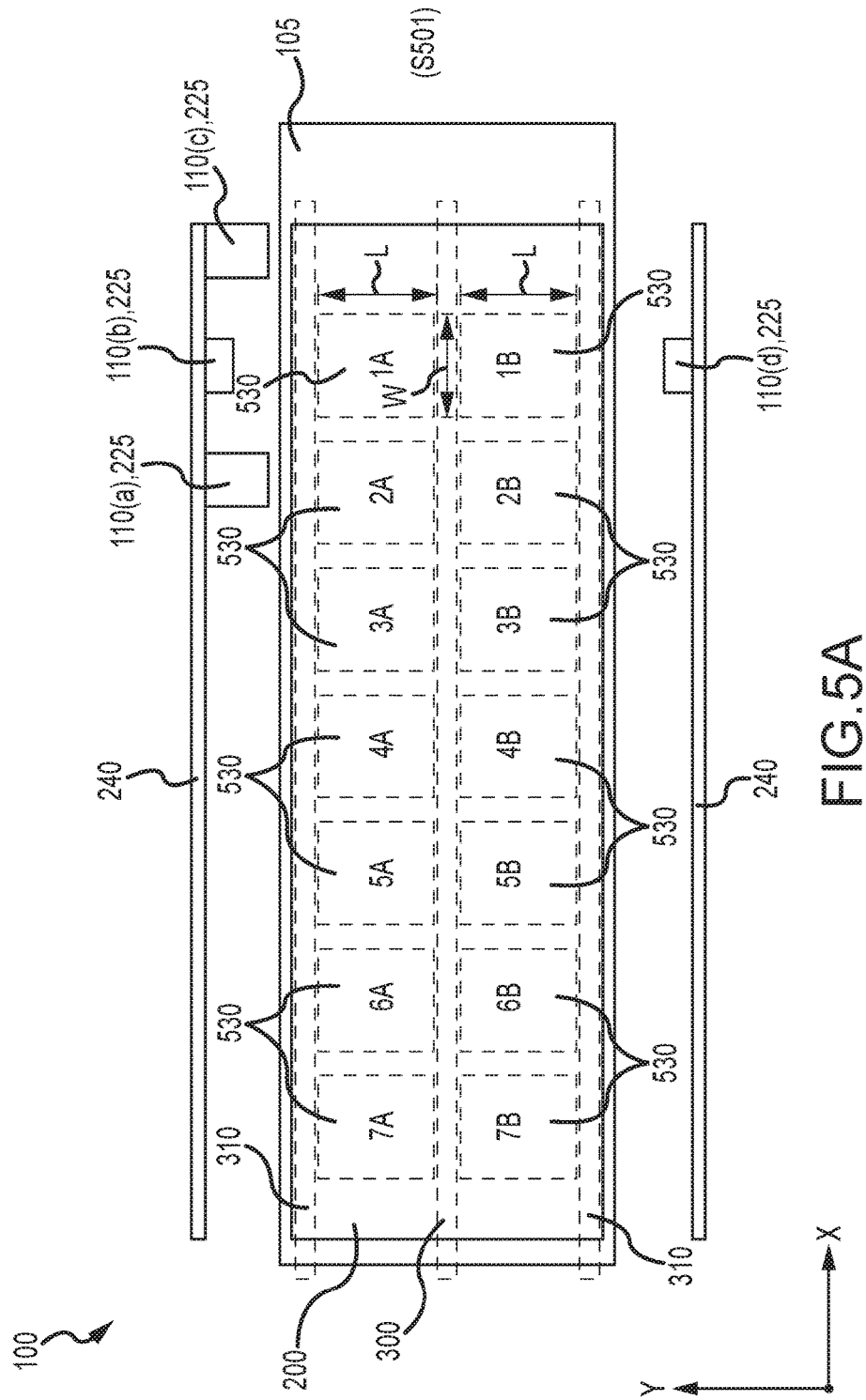
Figure 5B:
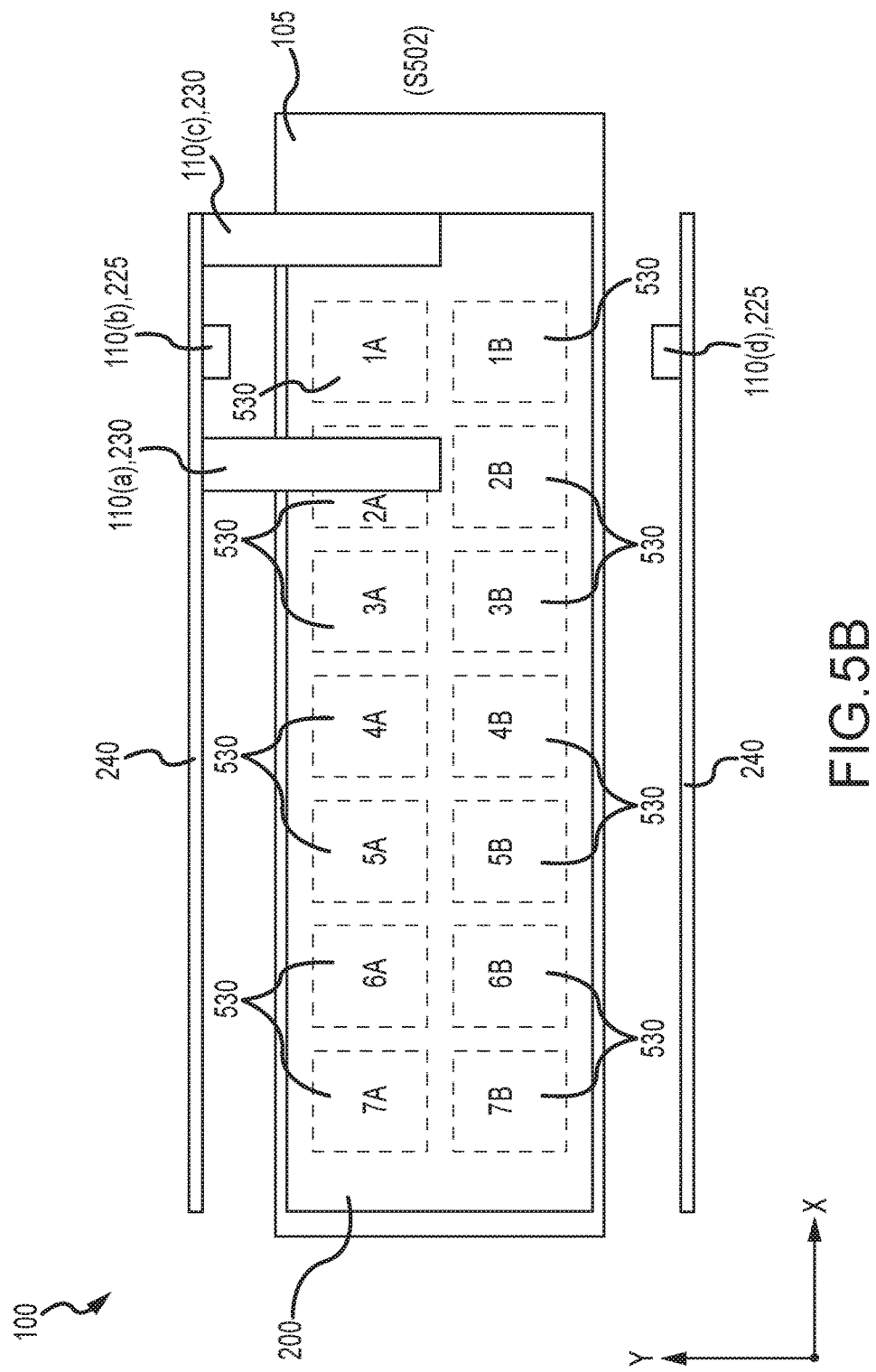
Figure 5C:
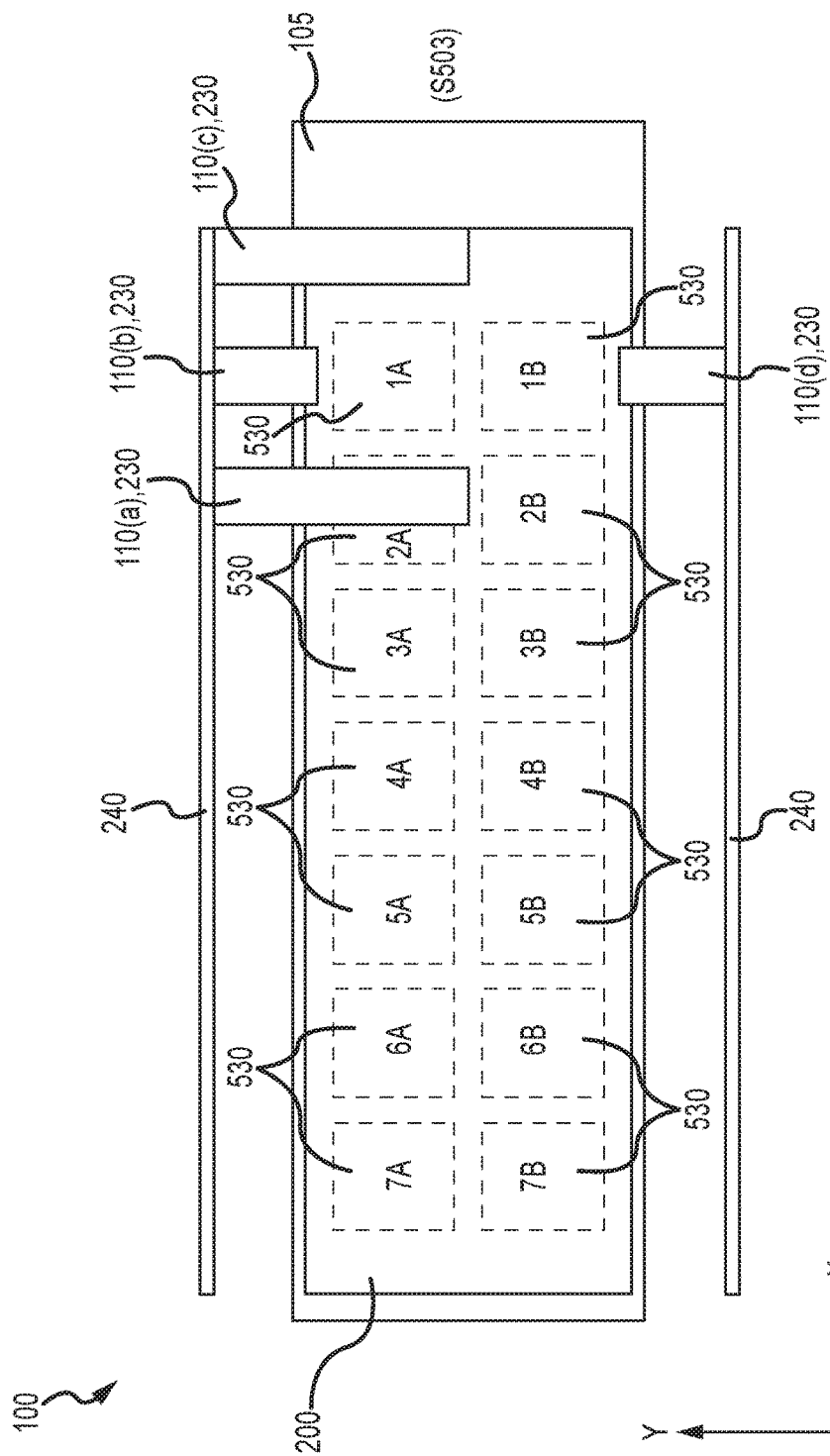
Figure 5D:
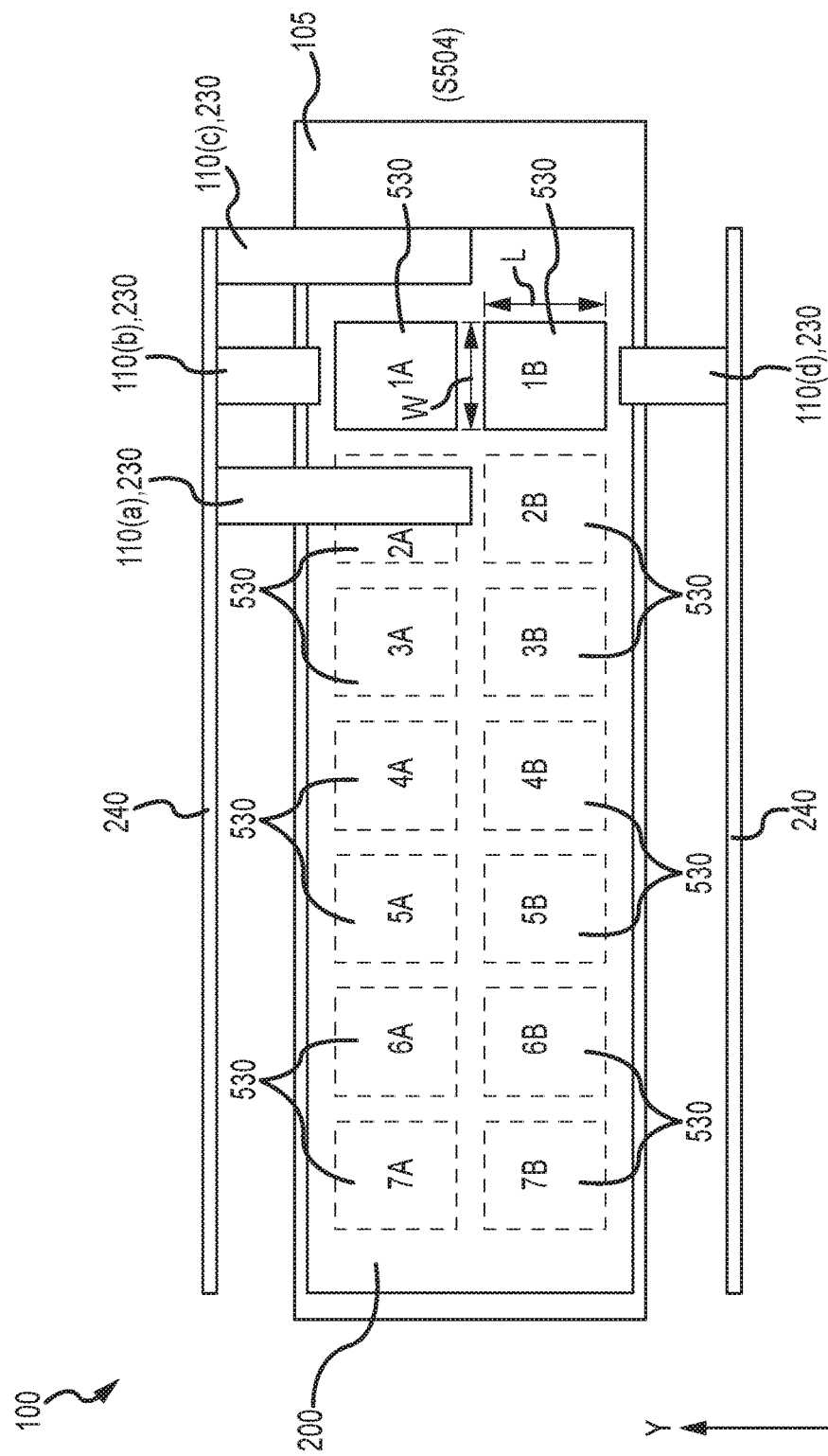
Figure 5E:
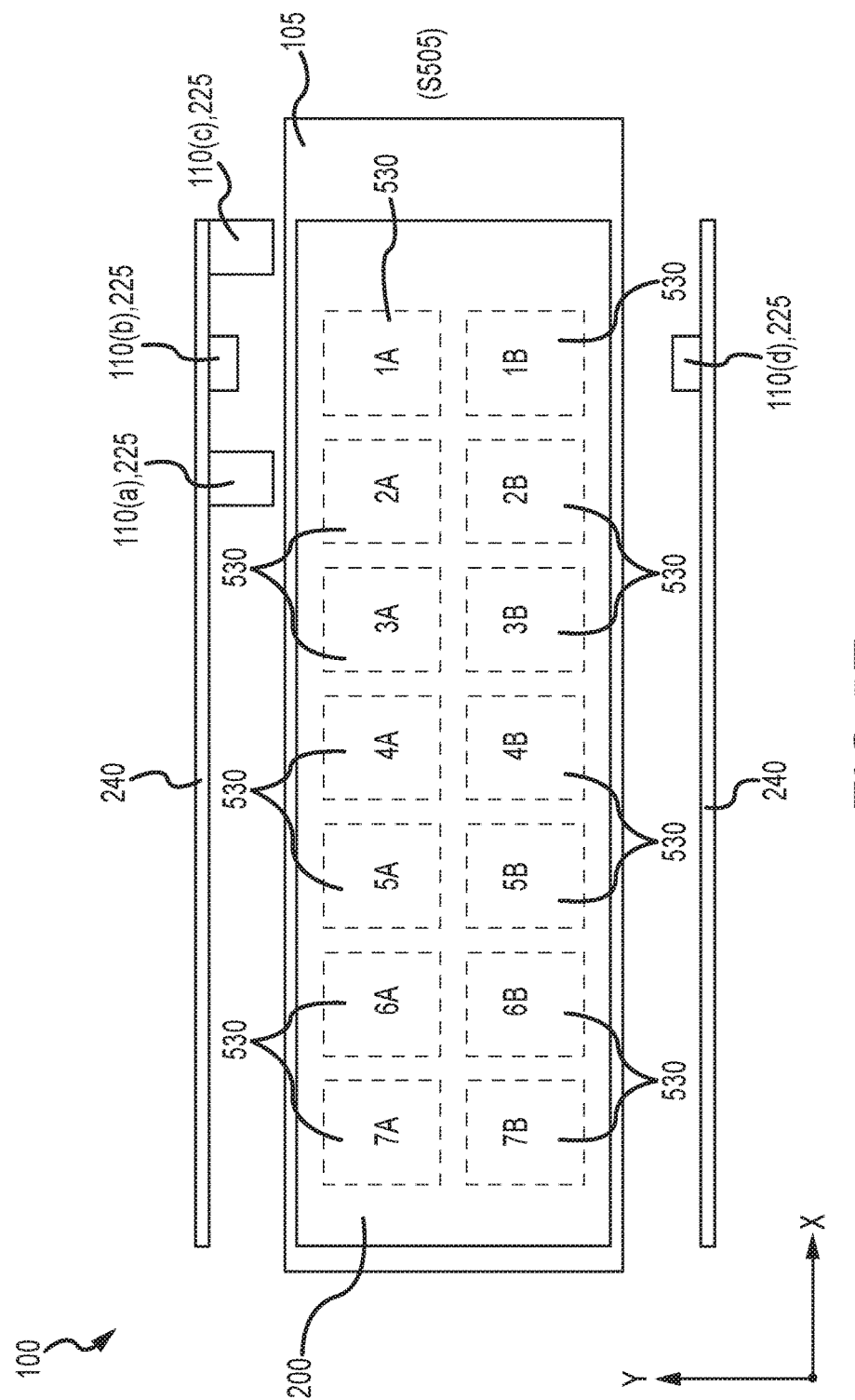
Figure 5F:
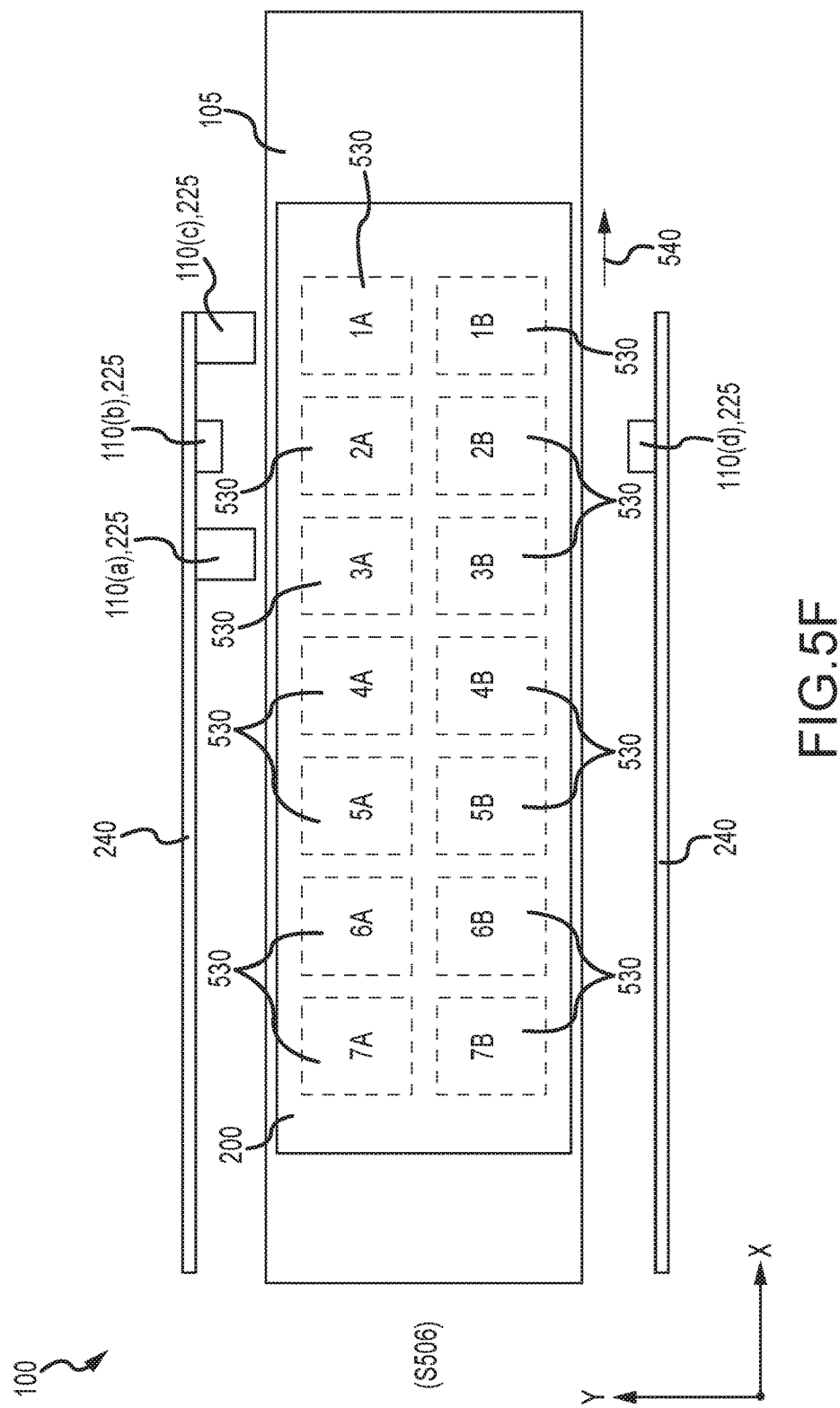
Figure 5G:
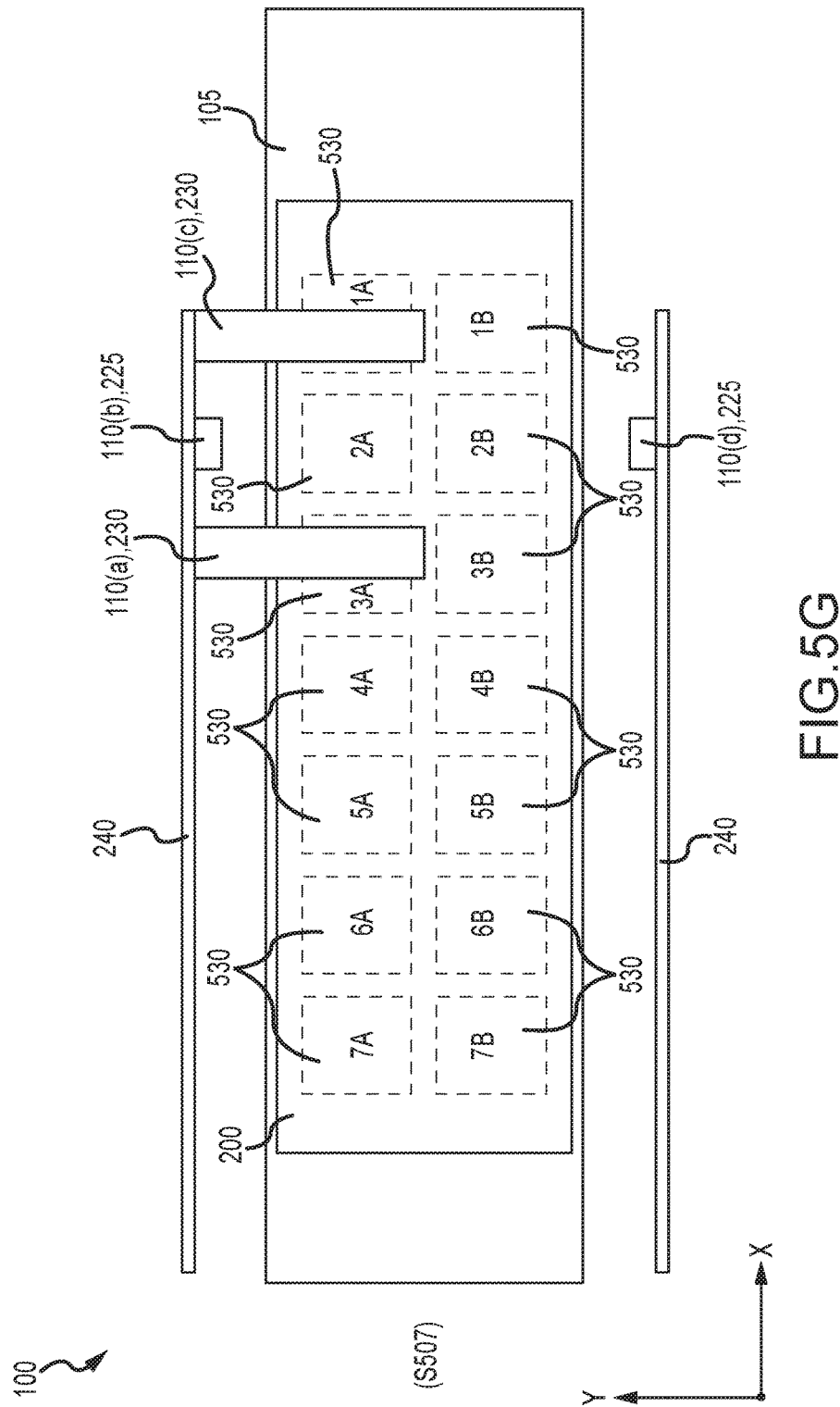
Figure 5I:
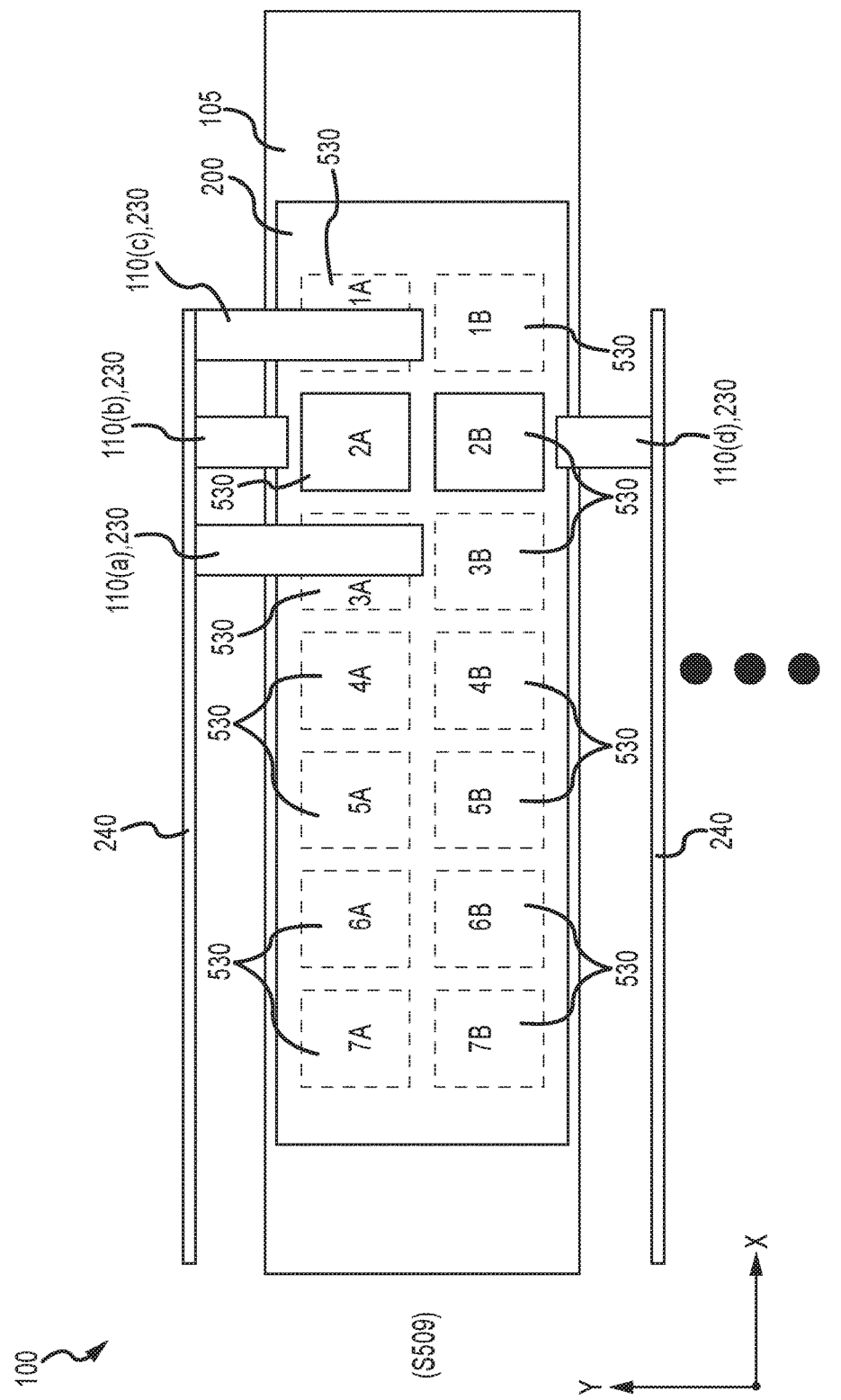
Figure 5J:
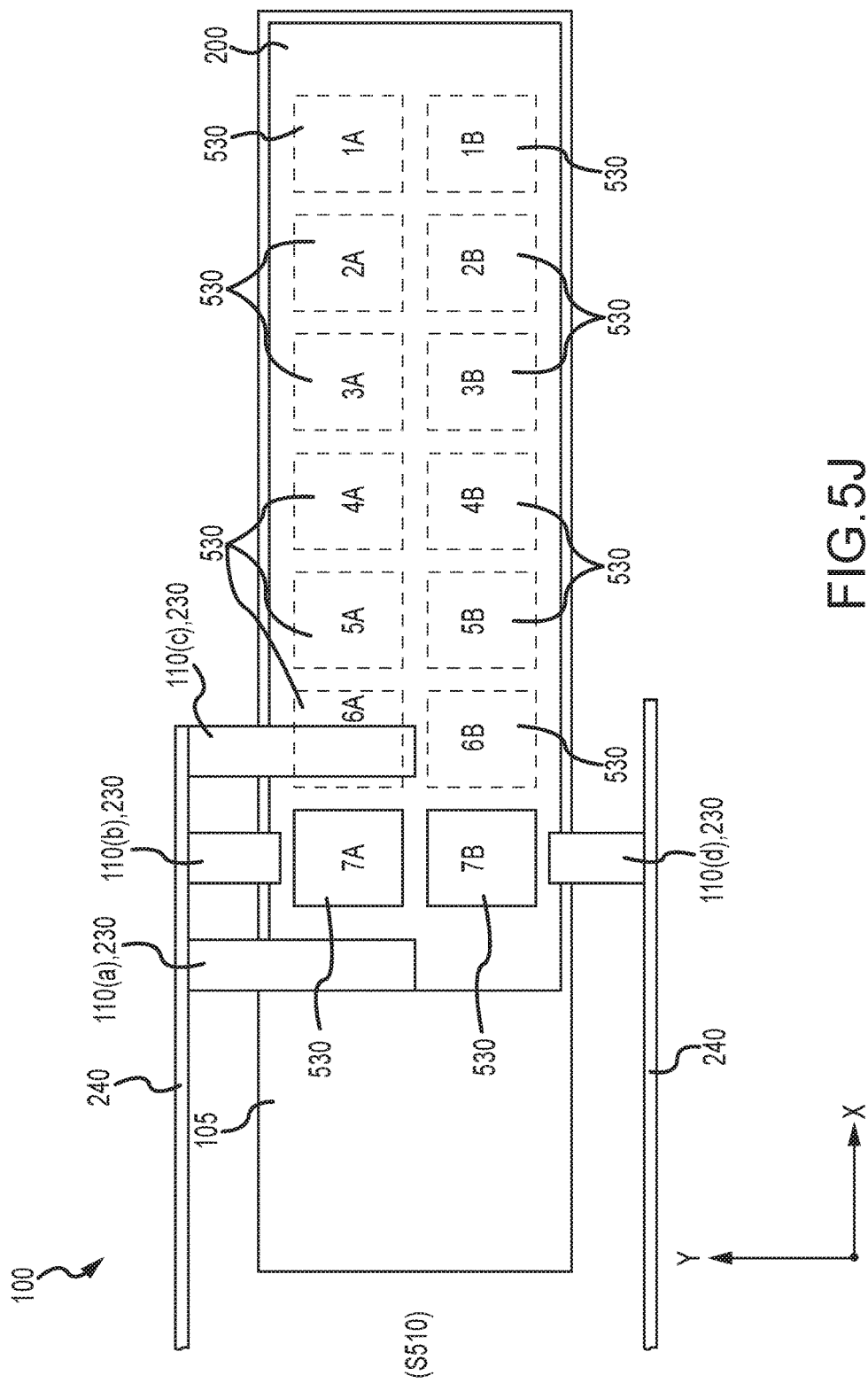

Referring now to FIGS. 2A and 3, the movable members 110 may have differing lengths, such that at least one of the movable members 110 may contact a first surface area 300 of the substrate 200 and another movable member 110 may contact a second surface area 310. For example, the first surface area 300 may comprise an area disposed along a center line 305 of an upward facing surface 245 of the substrate 200. Further, the second surface area 310 may comprise an area disposed on the upward facing surface 245 of the substrate 200 along a least one edge portion 315. In various embodiments, at least two of the plurality of movable members are positioned substantially off-center from one another. For example, as illustrated in FIGS. 1 and 5C, the movable members 110(a), 110(d) are positioned in a staggered pattern. In various embodiments, the movable members 110 may be spaced such that when the moveable members 110 are in the second position 230, a desired area remains exposed. Any number of contact configurations may be implemented to provide the desired contact positions suited to a particular application or substrate layout.

In one embodiment, each movable member 110 may apply a downward force F from the contact portion 210 to the upward facing surface 245 of the substrate 200. For example, the extendable arm 205 may be coupled to a hinge 250 and actuated or otherwise biased towards the substrate 200, such as by a motor, spring, piston, cylinder and rod system, or the like. In one embodiment, the moveable members may be coupled to a spring-biased hinge. The downward force F may help level the substrate 200 and/or to secure the substrate 200 to the stage 105. In one embodiment, the downward force applied by each of the movable members 110 may have the same value, though the downward force applied by each movable member may be different or vary, such as based on the substrate material, device layout, or particular application.

Referring again to FIG. 1, the movable members 110 may be disposed on multiple sides of the stage 105. For example, one or more of the movable members 110 may be disposed along a first side 125 of the stage, while the remaining movable members 110 may be disposed along an opposing second side 130 of the stage 105. In one exemplary embodiment, three of the movable members 110a, 110b, 110c may be disposed on the first side 125 of the stage 105, while the remaining movable member 110d may be disposed on the second side 130 of the stage 105.

Referring now to FIGS. 1 and 3, in an exemplary embodiment, the plurality of movable members 110 (FIG. 1) may be configured to make contact with multiple areas of the stage 105 or an object on the stage 105, such as the substrate 200. The movable members 110 (FIG. 1) may comprise extendable arms 205 of differing lengths, such that at least one of the movable members 110 may contact a first surface area 300 of the substrate 200 and another movable member 110 (FIG. 1) may contact a second surface area 310. For example, the first surface area 300 may comprise an area disposed along a center line 305 of the upward facing surface 245 of the substrate 200. Further, the second surface area 310 may comprise an area disposed on the upward facing surface 245 of the substrate 200 along a least one edge portion 315. Any number of contact configurations may be implemented to provide the desired contact positions suited to a particular application or substrate layout.

Figure 4A:
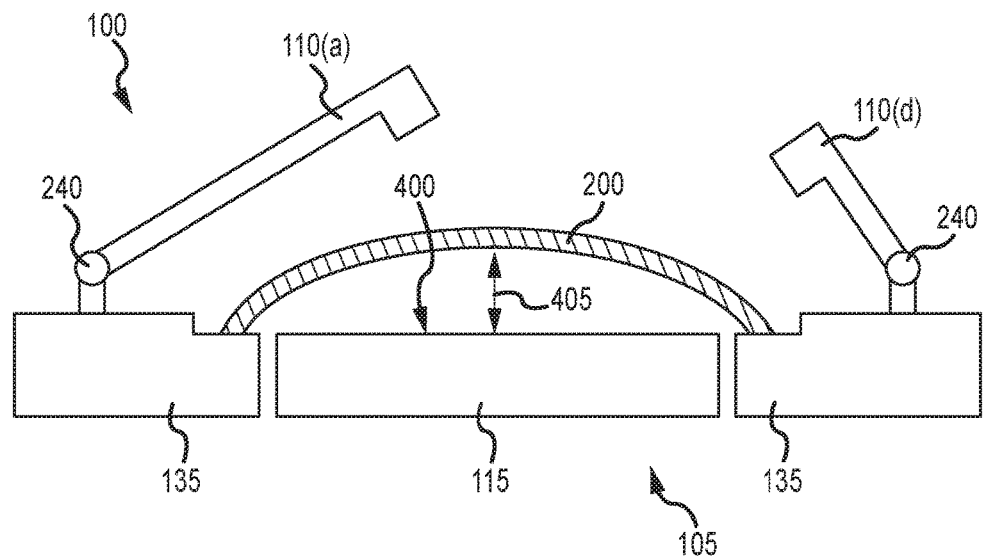
FIGS. 4A-C representatively illustrate an order of rotation of a plurality of movable members in accordance with an exemplary embodiment of the present technology.
Figure 4B:
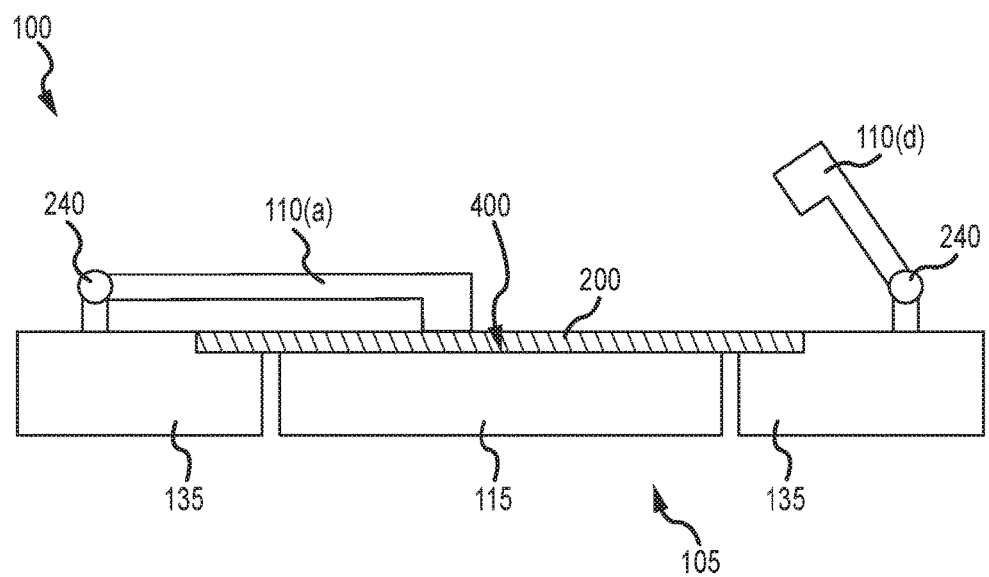
Figure 4C:
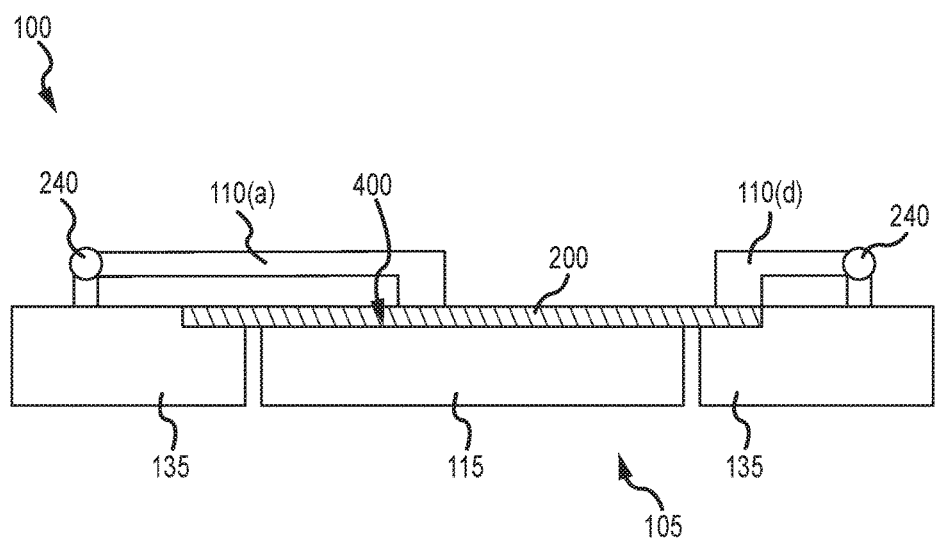

Referring now to FIGS. 4A-C, in an exemplary embodiment of the present technology, the movable members 110 may rotate between the first position 225 and the second position 230. In the exemplary embodiment, the movable members 110 may be electrically connected to a timing unit (not shown), such as controller or processor, which rotates the movable members 110 at any suitable interval, predetermined time, sequence, or the like. For example, a first movable member 110a may rotate from the first position 225 to the second position 230 at a first predetermined time, and a second movable member 110b may rotate from the first position 225 to the second position 230 at a second predetermined time.

The movable members 110 may begin in the first position 225 to allow the substrate 200 to be placed onto the stage 105. Once the substrate 200 has been placed on the stage 105, at least one of the movable members 110 may be rotated from the first position 225 to the second position 230, making contact with and applying the downward force F to the substrate 200. Another movable member 110 may be rotated from the first position 225 to the second position 230 as well. For example, the first movable member 110a and a third movable member 110c may rotate in unison from the first position 225 to the second position 230 at a first predetermined time, and the second movable member 110b and a fourth movable member 110d may rotate in unison from the first position 225 to the second position 230 at a second predetermined time.

The order in which the movable members 110 are rotated may be determined according to any suitable criteria such as substrate material, type of bond, substrate layout, particular application, or the like. The order of rotation described above, where the first and third movable members 110a, 110c make contact with the substrate at the first predetermined time and where the second and fourth movable members 110b, 110d make contact at the second predetermined time, may be selected to reduce both warpage of the substrate 200 and the air gap 405 between the substrate 200 and the stage 105 during operation without breaking the substrate 200. In various embodiments, the substrate 200 may be leveled so that it is flush with a receiving surface 400 of the stage 105 by utilizing the plurality of movable members 110 as described above.

Figure 8A:
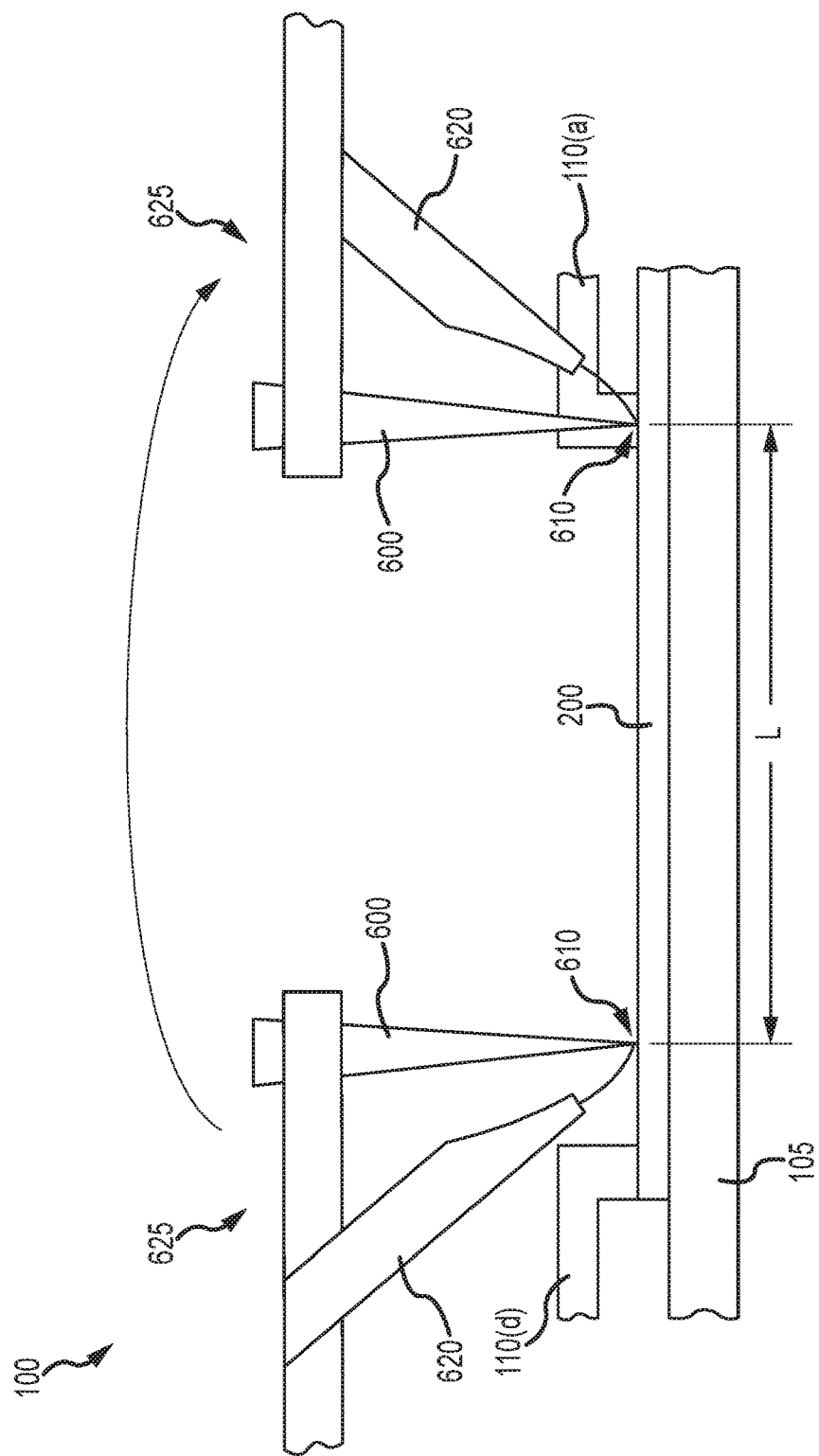
FIGS. 8A-B representatively illustrate wire bonding on a level substrate in accordance with an exemplary embodiment of the present technology.
Figure 8B:
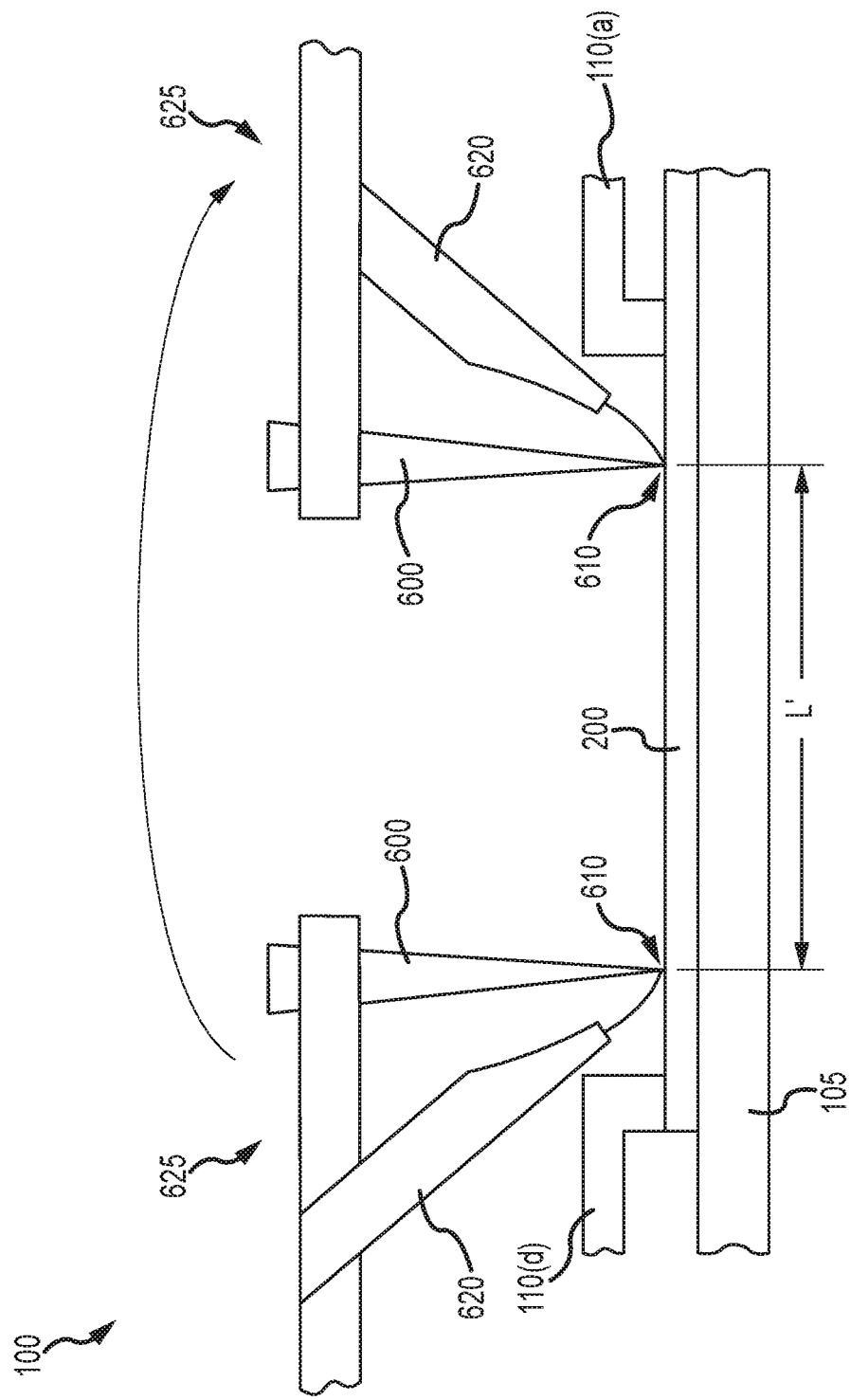

Referring now to FIGS. 5A-J, 6, 8 and 9, the movable members 110 may be arranged such that the movable members 110 do not interfere with the wire bonding machine 625 during the wire bonding process. In exemplary embodiments, the wire bonding machine 625 may rotate within the device area 530, for example as illustrated in FIGS. 8A-B, and may also move in two directions, such as an X direction and a Y direction. In various exemplary embodiments, at least two of the movable members 110 may make contact within the first surface area 300 which is substantially adjacent to a neighboring device area 530, for example, as illustrated in FIG. 8A and FIGS. 5A-J. This arrangement may allow the wire bonding machine 625 to move and rotate freely within the device area 530 without interference by the movable members 110.

Figure 9:
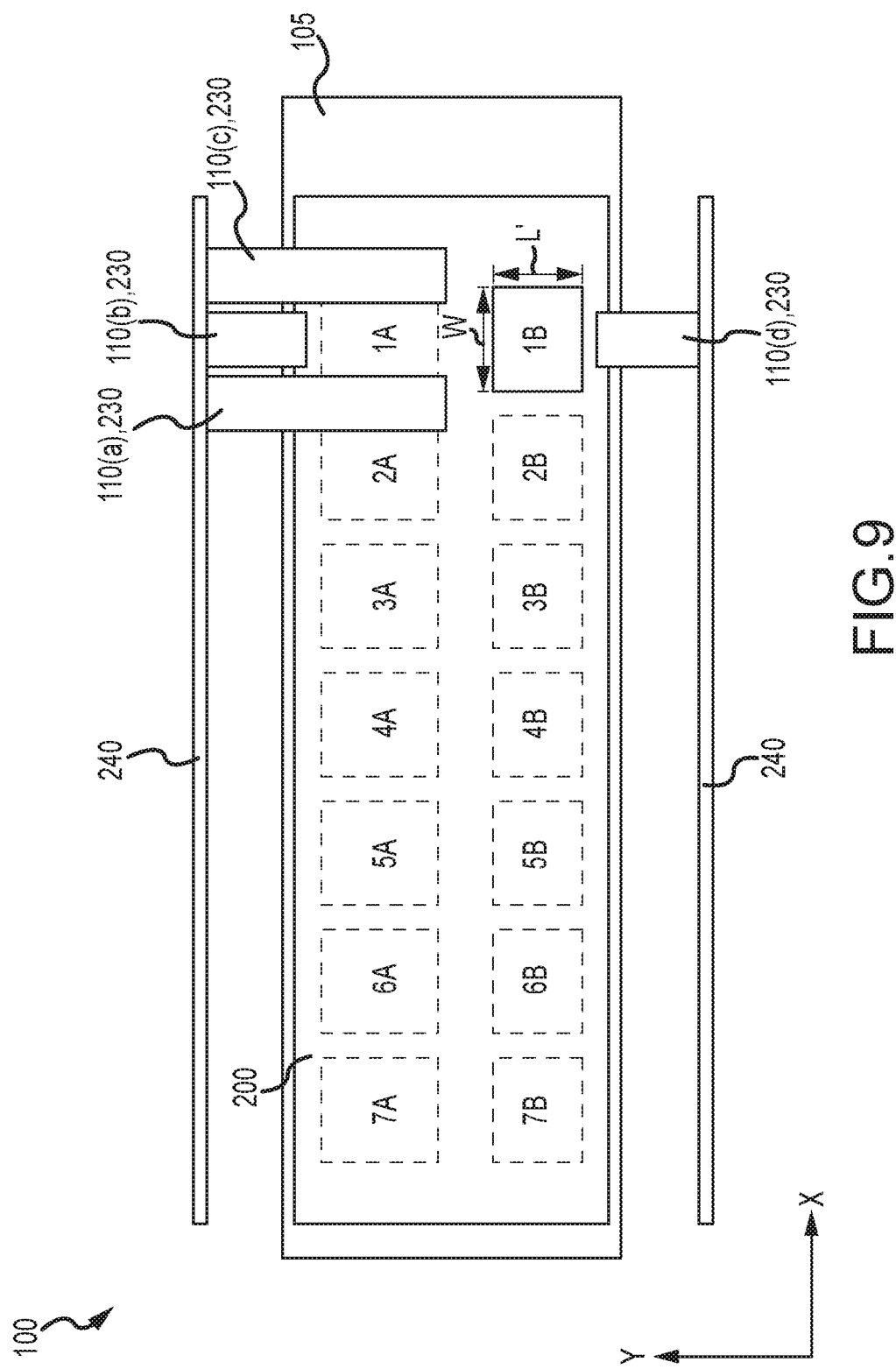
FIG. 9 representatively illustrates an alternative configuration of the plurality of movable members.

Conversely, alternative arrangements of the movable members 110 may interfere with the wire bonding machine 625 resulting in a reduced device area 530, for example, the arrangement illustrated in FIG. 8B and FIG. 9 where the device area 530 may have a length L' which may be less than the length L of the device area 530 illustrated in FIGS. 5A-J.

In various embodiments, methods and apparatus according to various aspects of the present invention may level the substrate 200 so that it is flush with the receiving surface 400 (FIGS. 4B-C), which allows the ultrasonic waves to be focused at the tip 610 of the wire bonding tool 600, tends to improve the frictional force between the wire bonding tool 600 and the wire 615, and may improve the bond to a bond pad 705. The apparatus 100 may also be utilized in a die bonding process, such as flip chip bonding, to provide a planar and more stable substrate as described above.

In operation, referring now to FIGS. 5A-J, the apparatus 100 may provide the stage 105 and movable members 110 in the first position 225. The substrate 200 may be transferred onto the stage 105 (S501), and at least two of the movable members 110, for example the first movable member 110a and the third movable member 110c, may be rotated to the second position 230 and contact the first surface area 300 comprising at least the center line 305 of the substrate 200 (S502). The remaining movable members 110, for example the second movable member 110b and the fourth movable member 110d, may be rotated to the second position 230. In the present embodiment, the remaining movable members 110 contact the second surface area 310 comprising at least an area substantially adjacent to the edge portion 315 of the substrate 200 (S503).

The apparatus and method may perform wire bonding within a predetermined device area 530, for example 1A and 1B (S504), where the device area 530 may comprise a length L and a width W. After wire bonding for the predetermined device area 530 has been completed, the movable members 110 may return to the first position 225 in unison (S505). The substrate 200 may be repositioned along a length of the substrate 200 so that the apparatus 100 may perform wire bonding on another device area 530, for example 2A and 2B (S506). Again, the movable members 110 rotate to the second position 225 timed in the manner as described above and the wire bonding is performed (S507-S510). Steps S501 through S506 may continue until all the device areas 530 receive wire bonding (S510).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for securing a substrate, comprising:
a main platform configured to support the substrate;
a plurality of movable members positioned above the main platform and rotatable between a first position and a second position, wherein each movable member:
allows the substrate to be positioned on the main platform when rotated to the first position; and
applies a force to a predetermined area on an upward facing surface of the substrate when rotated to the second position;
wherein a first movable member of the plurality of movable members has a first length and a second movable member of the plurality of movable members has a second length longer than the first length; and
wherein each movable member is coupled to a spring-biased hinge.

2. The apparatus of claim 1, wherein the main platform comprises:
a plurality of openings disposed along the main platform; and
a vacuum source in communication with the openings.

3. The apparatus of claim 2, wherein the openings are arranged in a row pattern.

4. The apparatus of claim 1, wherein at least two of the plurality of movable members are positioned substantially off-center from one another.

5. An apparatus for reducing warpage in a substrate, comprising:
a stage configured to support the substrate and comprising a plurality of openings;
a vacuum source configured to allow a vacuum pressure to be applied to a downward facing surface of the substrate via the plurality of openings;
a first shaft running parallel to a first side of the stage;
a first rotating member positioned above the stage, pivotably coupled to the first shaft, and rotatable between a first position and a second position; wherein the first rotating member has a first length;
a second shaft running parallel to a second side of the stage;
a second rotating member positioned above the stage, pivotably coupled to the second shaft, and rotatable between the first position and the second position; wherein the second rotating member has a second length longer than the first length;
a third rotating member having the first length and pivotably coupled to the first shaft; and
a fourth rotating member having the second length and pivotably coupled to the first shaft;
wherein the first rotating member applies a first spring force to a first upward facing surface area of the substrate at a first predetermined time, and the second rotating member applies a second spring force to a second upward facing surface area of the substrate at a second predetermined time.

6. The apparatus of claim 1, further comprising:
a first shaft positioned adjacent to a first side of the main platform;
a second shaft positioned adjacent to a second side of the main platform, wherein the second side is opposite from the first side.

7. The apparatus of claim 6, wherein a first end of each movable member is pivotably coupled to one of the first and second shafts.

8. The apparatus of claim 7, wherein:
the first movable member is coupled to the first shaft; and
the second movable member is coupled to the second shaft.

9. The apparatus of claim 1, wherein:
each movable member comprises:
a first end coupled to a shaft; and
a second end, opposite from the first end, comprising a contact portion.

10. The apparatus of claim 9, wherein the second end of at least one movable member terminates at a center portion of the main platform.

11. The apparatus of claim 5, wherein the second rotating member terminates at a center portion of the stage.

* * * * *